US010447046B2

United States Patent
Ravi et al.

(10) Patent No.: US 10,447,046 B2
(45) Date of Patent: Oct. 15, 2019

(54) SECONDARY BATTERY MANAGEMENT SYSTEM WITH REMOTE PARAMETER ESTIMATION

(71) Applicant: Robert Bosch GmbH, Stuttgart (DE)

(72) Inventors: Nikhil Ravi, Mountain View, CA (US); Anahita MirTabatabaei, San Francisco, CA (US); Reinhardt Klein, Mountain View, CA (US); Ashish Krupadanam, Cupertino, CA (US); John F. Christensen, Elk Grove, CA (US)

(73) Assignee: Robert Bosch GmbH, Stuttgart (DE)

( * ) Notice: Subject to any disclaimer, the term of this patent is extended or adjusted under 35 U.S.C. 154(b) by 151 days.

(21) Appl. No.: 15/273,040

(22) Filed: Sep. 22, 2016

(65) Prior Publication Data

US 2018/0083461 A1   Mar. 22, 2018

(51) Int. Cl.
| | |
|---|---|
| *H02J 7/00* | (2006.01) |
| *G06F 1/28* | (2006.01) |
| *H02J 13/00* | (2006.01) |
| *G06F 1/30* | (2006.01) |
| *H01M 10/42* | (2006.01) |
| *G01R 31/367* | (2019.01) |

(52) U.S. Cl.
CPC .......... *H02J 7/0021* (2013.01); *G01R 31/367* (2019.01); *G06F 1/28* (2013.01); *G06F 1/30* (2013.01); *H01M 10/425* (2013.01); *H02J 7/007* (2013.01); *H02J 13/0003* (2013.01); *H01M 2010/4271* (2013.01); *H01M 2010/4278* (2013.01)

(58) Field of Classification Search
CPC .............................. H02J 7/0021; H02J 7/007
USPC .......................................................... 320/107
See application file for complete search history.

(56) References Cited

U.S. PATENT DOCUMENTS

| | | |
|---|---|---|
| 6,515,456 B1 | 2/2003 | Mixon |
| 6,534,954 B1 | 3/2003 | Plett |
| 7,612,532 B2 | 11/2009 | Verbrugge |
| 8,008,891 B2 | 8/2011 | Yun et al. |
| 8,103,485 B2 | 1/2012 | Plett |
| 8,116,998 B2 | 2/2012 | Hess |
| 8,188,715 B2 | 5/2012 | Christensen et al. |

(Continued)

FOREIGN PATENT DOCUMENTS

| | | |
|---|---|---|
| DE | 102005008511 A1 | 8/2006 |
| EP | 2816366 A1 | 12/2014 |

(Continued)

OTHER PUBLICATIONS

B. F. Lund and B. A. Foss, "Parameter ranking by orthogonalization—Applied to nonlinear mechanistic models," Automatica, vol. 44, No. 1, pp. 278-281, 2008.

(Continued)

*Primary Examiner* — Suchin Parihar
(74) *Attorney, Agent, or Firm* — Michael Best & Friedrich LLP

(57) ABSTRACT

A battery system, having a battery management system configured to determine the state of charge and state of health of a secondary battery. The battery management system may export data to and receive inputs from a remote computer which calculates at least a portion of the state of health of the battery.

18 Claims, 4 Drawing Sheets

(56) References Cited

U.S. PATENT DOCUMENTS

| | | | |
|---|---|---|---|
| 8,310,201 B1* | 11/2012 | Wright | G08C 17/02 320/108 |
| 8,321,164 B2 | 11/2012 | Liu et al. | |
| 8,346,495 B2 | 1/2013 | Gering | |
| 8,467,984 B2 | 6/2013 | Gering | |
| 8,548,762 B2 | 10/2013 | Prada et al. | |
| 8,635,038 B2 | 1/2014 | Benjamin et al. | |
| 8,896,315 B1* | 11/2014 | Davies | H02J 7/0016 324/434 |
| 8,965,723 B2 | 2/2015 | Jo et al. | |
| 9,086,462 B2 | 7/2015 | Mao | |
| 2001/0032666 A1 | 10/2001 | Jenson et al. | |
| 2002/0097026 A1 | 7/2002 | Kernahan et al. | |
| 2003/0076109 A1 | 4/2003 | Verbrugge et al. | |
| 2004/0135548 A1 | 7/2004 | Takano et al. | |
| 2004/0220758 A1 | 11/2004 | Barsoukov et al. | |
| 2006/0111854 A1 | 5/2006 | Plett | |
| 2006/0170397 A1* | 8/2006 | Srinivasan | G01R 31/3624 320/132 |
| 2006/0284600 A1 | 12/2006 | Verbrugge | |
| 2007/0299620 A1 | 12/2007 | Yun et al. | |
| 2008/0074082 A1 | 3/2008 | Tae et al. | |
| 2008/0103709 A1 | 5/2008 | Yun et al. | |
| 2008/0281244 A1 | 11/2008 | Jacobs | |
| 2009/0210179 A1 | 8/2009 | Tang et al. | |
| 2009/0326842 A1 | 12/2009 | Thomas-Alyea | |
| 2010/0033132 A1 | 2/2010 | Nishi et al. | |
| 2011/0025258 A1 | 2/2011 | Kim et al. | |
| 2011/0288797 A1 | 11/2011 | Schmidt | |
| 2012/0101753 A1 | 4/2012 | Lin et al. | |
| 2012/0105001 A1 | 5/2012 | Gallegos et al. | |
| 2012/0150507 A1 | 6/2012 | Gallestey et al. | |
| 2012/0175953 A1 | 7/2012 | Ohkawa et al. | |
| 2012/0299552 A1 | 11/2012 | Machida | |
| 2012/0306438 A1 | 12/2012 | Howard et al. | |
| 2012/0313449 A1 | 12/2012 | Kurs et al. | |
| 2013/0006454 A1* | 1/2013 | Li | B60W 10/26 701/22 |
| 2013/0051587 A1 | 2/2013 | Stephanou et al. | |
| 2013/0085696 A1 | 4/2013 | Xu et al. | |
| 2013/0086409 A1* | 4/2013 | Lu | H04L 12/2807 713/340 |
| 2013/0300190 A1 | 11/2013 | Mao et al. | |
| 2013/0300377 A1 | 11/2013 | Mao et al. | |
| 2013/0322488 A1 | 12/2013 | Yazami et al. | |
| 2014/0015488 A1 | 1/2014 | Despesse | |
| 2014/0089692 A1 | 3/2014 | Hanafusa | |
| 2014/0222358 A1 | 8/2014 | Morita et al. | |
| 2014/0225620 A1* | 8/2014 | Campbell | B60L 11/1838 324/426 |
| 2014/0229129 A1* | 8/2014 | Campbell | H04Q 9/00 702/63 |
| 2014/0236511 A1 | 8/2014 | Kulkarni et al. | |
| 2014/0244225 A1 | 8/2014 | Balasingam et al. | |
| 2014/0278167 A1 | 9/2014 | Frost et al. | |
| 2014/0342193 A1 | 11/2014 | Mull et al. | |
| 2014/0350877 A1 | 11/2014 | Chow et al. | |
| 2015/0022157 A1 | 1/2015 | Takahashi | |
| 2015/0046106 A1 | 2/2015 | Wade et al. | |
| 2015/0066406 A1 | 3/2015 | Sun et al. | |
| 2015/0147608 A1 | 5/2015 | Lin et al. | |
| 2015/0197164 A1* | 7/2015 | Lee | B60L 11/1864 701/22 |
| 2015/0226807 A1 | 8/2015 | Aumentado et al. | |
| 2015/0234013 A1 | 8/2015 | Migita et al. | |
| 2015/0248149 A1 | 9/2015 | Yamazaki et al. | |
| 2015/0251555 A1 | 9/2015 | Li et al. | |
| 2015/0251556 A1 | 9/2015 | Meyer | |
| 2015/0260800 A1 | 9/2015 | Baba et al. | |
| 2015/0268306 A1 | 9/2015 | Sugiyama et al. | |
| 2015/0302723 A1* | 10/2015 | Reade | G01R 31/3689 340/636.1 |
| 2015/0326038 A1 | 11/2015 | Lee | |
| 2016/0046199 A1* | 2/2016 | Butler | B60L 11/1846 320/106 |
| 2016/0090001 A1 | 3/2016 | Nomoto et al. | |
| 2016/0241058 A1 | 8/2016 | Carralero et al. | |
| 2016/0259011 A1 | 9/2016 | Joe | |
| 2017/0144562 A1* | 5/2017 | Thomas | B60L 11/1861 |
| 2017/0222449 A1 | 8/2017 | MirTabatabaei et al. | |
| 2017/0271984 A1* | 9/2017 | Kohn | H02M 3/156 |

FOREIGN PATENT DOCUMENTS

| | | |
|---|---|---|
| KR | 20150043214 A | 4/2015 |
| WO | 2006057468 A1 | 6/2006 |
| WO | 2006057469 A1 | 6/2006 |
| WO | 2008154956 A1 | 12/2008 |
| WO | 2011050924 A1 | 5/2011 |
| WO | 2014130519 A1 | 8/2014 |
| WO | 2015025212 A1 | 2/2015 |
| WO | 2015056963 A1 | 4/2015 |
| WO | 2015056964 A1 | 4/2015 |
| WO | 2015185802 A1 | 12/2015 |

OTHER PUBLICATIONS

Fuller et al., "Simulation and Optimization of the Dual Lithium Ion Insertion Cell," J. Electrochem. Soc., vol. 141, No. 1, Jan. 1994, pp. 1-10.

Ioannou et al., "Robust adaptive control." Courier Corporation, 2012.

K. Thomas, J. Newman and R. Darling, "Mathematical Modeling of Lithium Batteries," Kluwer Academic/Plenum Publishers, pp. 345-392, 2002.

Klein, R. et al., 2013. "Electrochemical Model Based Observer Design for a Lithium-Ion Battery." Control Systems Technology, IEEE Transactions on, 21(2), pp. 289-301.

M. Doyle, T.F. Fuller, J. Newman, "Modeling of Galvanostatic Charge and Discharge of the Lithium/Polymer/Insertion Cell", Journal of the Electrochemical Society, 1993.

Mayhew et al., "Investigation of projection-based model-reduction techniques for solid-phase diffusion in Li-ion batteries," American Control Conference (ACC), 2014 , pp. 123-128, Jun. 4-6, 2014.

Moura et al., "Adaptive PDE Observer for Battery SOC/SOH Estimation," ASME 2012 5th Annual Dynamic Systems and Control Conference joint with the JSME 2012 11th Motion and Vibration Conference, 2012 (10 pages).

Murray, Chapter 3, State Estimation, Caltech, (https://www.cds.caltech.edu/~murray/wiki/images/b/b3/Stateestim.pdf) available online as early as Sep. 20, 2006, pp. 9-17.

N. Chaturvedi, et al., "Modeling, estimation, and control challenges for lithium-ion batteries," 2010 American Control Conference, pp. 1997-2002, 2010.

N. Chaturvedi, J. Christensen, R. Klein and A. Kojic, "Approximations for Partial Differential Equations Appearing in Li-Ion Battery Models," ASME 2013 Dynamic Systems and Control Conference (10 pages).

N. Chaturvedi, R. Klein, J. Christensen, J. Ahmed and A. Kojic, "Algorithms for Advanced Battery Management Systems," IEEE Control Systems Magazine, vol. 30, No. 3, pp. 49-68, 2010.

Pattel, "An Evaluation of the Moving Horizon Estimation Algorithm for Online Estimation of Battery State of Charge and State" Thesis, Purdue University, Dec. 2014.

Ramadesigan et al., "Modeling and Simulation of Lithium-Ion Batteries from a Systems Engineering Perspective," Journal of the Elect rochemical Society, 159 (3) R3 I-R45 (2012).

Rao, C. V., Rawlings, J. B., & Mayne, D. Q. (2003). "Constrained state estimation for nonlinear discrete-time systems: Stability and moving horizon approximations." Automatic Control, IEEE Transactions, 48(2), 246-258.

Tenny, M. J., & Rawlings, J. B. (2002). "Efficient moving horizon estimation and nonlinear model predictive control." In American Control Conference, 2002. Proceedings of the 2002 (vol. 6, pp. 4475-4480). IEEE.

(56) References Cited

OTHER PUBLICATIONS

Thomas, "Lithium-Ion Batteries: Thermal and Interfacial Phenomena," Dissertation, Princeton University, 1996, published 2002, pp. 66-73.
Written Opinion of the International Searching Authority for Application No. PCT/EP2017/051333 dated May 9, 2017 (10 pages).
International Search Report for Application No. PCT/EP2017/051325 dated Apr. 7, 2017 (5 pages).
Ma Yan et al., "Lithium-ion Battery State of Charge Estimation based on Moving Horizon", Proceedings of the 11th World Congress on Intelligent Control and Automation, Jun. 29, 2014 (Jun. 29, 2014),-Jul. 4, 2014 (Jul. 4, 2014), pp. 5002-5007.
Sridhar Ungarala, "Computing arrival cost parameters in moving horizon estimation using sampling based filters", Journal of Process Control, vol. 19, No. 9, Oct. 2009 (Oct. 2009), pp. 1576-1588.
Non-Final Office Action from the U.S. Patent and Trademark Office for U.S. Appl. No. 15/010,873 dated Aug. 31, 2018 (9 pages).

\* cited by examiner

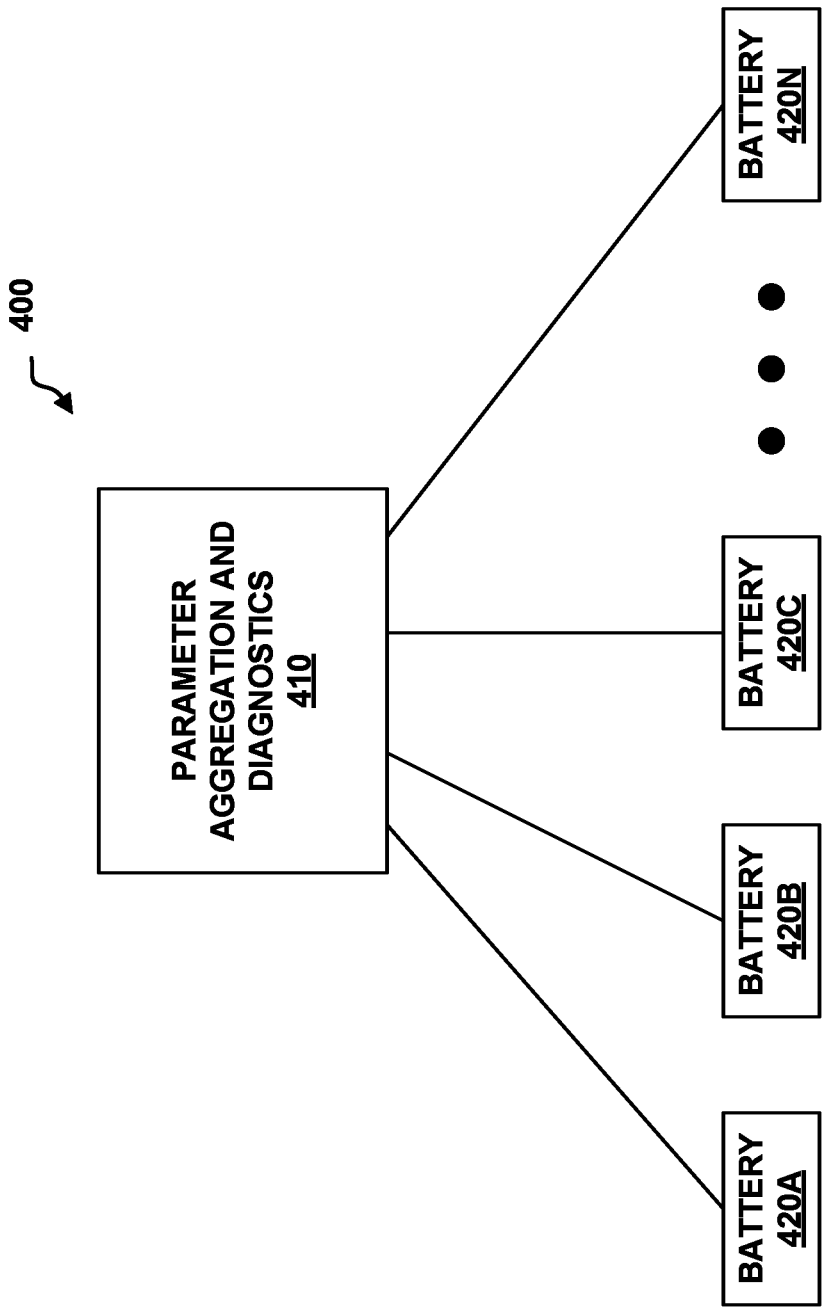

SECONDARY BATTERY MANAGEMENT SYSTEM WITH REMOTE PARAMETER ESTIMATION

STATEMENT REGARDING FEDERALLY SPONSORED RESEARCH

This invention was made with government support under ARPA-E Award No. DE-AR0000278 awarded by the U.S. Department of Energy. The U.S. government has certain rights in the invention.

FIELD

The invention generally relates to batteries, and more particularly to managing the operation of a battery.

BACKGROUND

Rechargeable lithium batteries are attractive energy storage devices for portable electric and electronic devices and electric and hybrid-electric vehicles because of their high specific energy compared to other electrochemical energy storage devices. A typical lithium cell contains a negative electrode, a positive electrode, and a separator located between the negative and positive electrodes. Both electrodes contain active materials that react with lithium reversibly. In some cases, the negative electrode may include lithium metal, which can be electrochemically dissolved and deposited reversibly. The separator contains an electrolyte with a lithium cation, and serves as a physical barrier between the electrodes such that none of the electrodes are electrically connected within the cell.

Typically, during charging, there is generation of electrons at the positive electrode and consumption of an equal amount of electrons at the negative electrode. During discharging, opposite reactions occur.

During repeated charge/discharge cycles of the battery undesirable side reactions occur. These undesirable side reactions result in the reduction of the capacity of the battery to provide and store power.

SUMMARY

A battery management system can be used to regulate the operation of the battery as the condition of the battery changes over time. The battery management system employs a mathematical model of the battery in order to efficiently manage battery operation. However, modelling a battery can involve complex mathematical models which are computationally expensive to process. In order to reduce the computational load placed on the battery management system (and, thereby, reduce the cost and complexity of the hardware materials required to implement the battery management system), the identification and calculation of the various states and parameters of the models can be distributed between a local battery management system and a remote calculating system.

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure are related to a battery system comprising a processor and a memory storing instructions that, when executed by the processor, cause the battery system to: determine, based on an output of a sensor, at least one measured characteristic of a battery; transmit the at least one measured characteristic from the battery system to a remote processing system; receive, by the battery system from the remote processing system, at least one parameter value calculated by the remote processing system based on the at least one measured characteristic and using a physics-based battery model, the at least one parameter value being indicative of a physical condition of the battery; calculate, by the battery system, a value indicative of a state of the battery based on the at least one parameter received from the remote processing system; and regulate operation of the battery based on the calculated state of the battery.

Another embodiment includes, a battery network comprising, a processor and a memory storing instructions that, when executed by the processor, cause the battery network to: receive at least one parameter of at least one battery system at a first time; receive at least one parameter of at least one battery system at a second time; determine a norm based on the at least one parameter at the first time and the at least one parameter at the second time; and identify a fault in a battery system based on the at least one parameter of the battery system and the norm.

The details of one or more features, aspects, implementations, and advantages of this disclosure are set forth in the accompanying drawings, the detailed description, and the claims below.

BRIEF DESCRIPTION OF THE DRAWINGS

FIG. 4 is a block diagram of a battery network that aggregates data from multiple battery systems and provides diagnostic support to networked battery systems, in accordance with some embodiments.

DETAILED DESCRIPTION

One or more specific embodiments will be described below. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
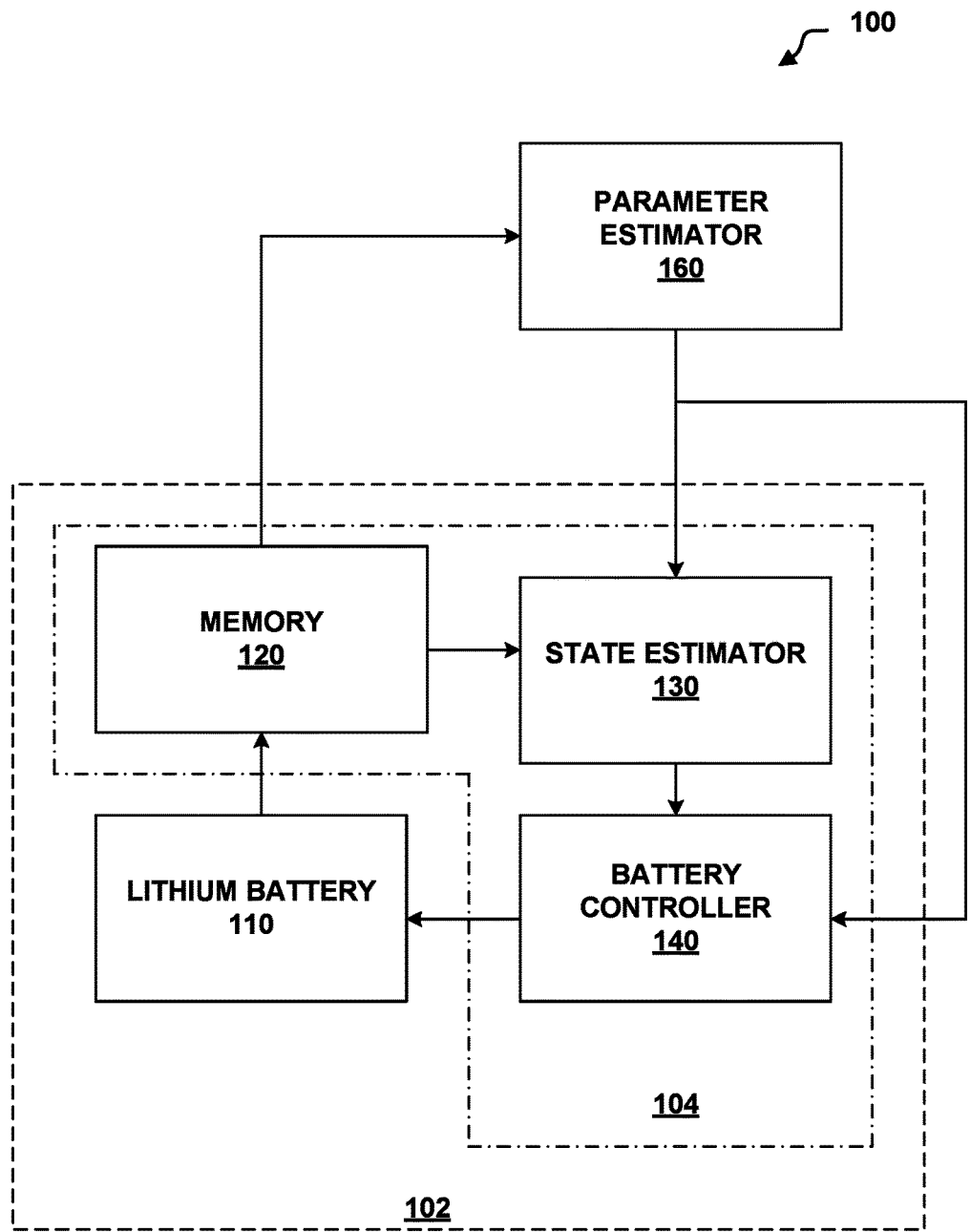
FIG. 1 is a block diagram of a battery system that applies a local battery state estimator and a remote parameter estimator, in accordance with some embodiments.

An embodiment of a battery system 100 is shown in FIG. 1. The battery system 100 includes a powered device 102 (e.g., passenger vehicle, consumer electronic device, home, etc.) having a battery 110, which is communicatively connected to a local battery management system (BMS) 104. In one example, the battery management system 104 is electrically connected to the battery 110 via electrical links (e.g., wires). In another example, the battery management system 104 may be wirelessly connected to the battery 110 via a wireless communication network. The local battery management system 104 includes a local memory 120, a state estimator 130, and a battery controller 140. The battery management system 104 may include separately configured components, for example, a microprocessor, memory, and input/output components or may include a microcontroller (with memory and input/output components on a single chip or within a single housing) and combinations thereof.

The battery management system 104 may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The battery management system 104 may also include a user interface, a communication interface, and other computer implemented devices for performing features not defined herein may be incorporated into the system. In some examples, the battery management system 104 may include other computer implemented devices such as a communication interface, a user interface, a network communication link, and an interface bus for facilitating communication between various interface devices, computing implemented devices, and one or more peripheral interfaces to the microprocessor.

In the example of FIG. 1, the memory 120 of the battery management system 104 stores computer-readable instructions that, when executed by the electronic processor of the battery management system 104 cause the state estimator 130 and battery controller 140 of the battery management system 104 to perform or control the performance of various functions or methods attributed to battery management system 104 herein (e.g., calculate an estimated state of the battery system, regulate the operation of the battery system, detect an internal short from a dendrite formation). The memory 120 may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the battery management system 104 herein—specifically, the state estimator 130 and the battery controller 140—may be embodied as software executed on an electronic processor of the battery management system 104, firmware, hardware or any combination thereof. In the above examples, the battery management system 104 may be configured to receive the data from various sources (e.g., the battery 110, the parameter estimator 160, etc.) and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, or other suitable network.

The local battery management system 104 is communicatively connected to a remote parameter estimator 160. The remote parameter estimator 160 may include for example, a mainframe, a server, a desktop computer, a tablet, a smartphone, or other device comprising a microprocessor, memory, input/output components, and/or communication components and combinations thereof.

The remote parameter estimator 160 may also be implemented using other components or combinations of components including, for example, a digital signal processor (DSP), an application specific integrated circuit (ASIC), a field-programmable gate array (FPGA), or other circuitry. Depending on the desired configuration, the processor of the parameter estimator 160 may include one more levels of caching, such as a level cache memory, one or more processor cores, and registers. The example processor core may include an arithmetic logic unit (ALU), a floating point unit (FPU), or any combination thereof. The remote parameter estimator 160 may also include a user interface, a communication interface, and other computer implemented devices for performing features not defined herein may be incorporated into the system. In some examples, the remote parameter estimator 160 may include other computer implemented devices such as a communication interface, a user interface, a network communication link, and an interface bus for facilitating communication between various interface devices, computing implemented devices, and one or more peripheral interfaces to the microprocessor.

In the example of FIG. 1, the parameter estimator 160 includes a memory storing computer-readable instructions that, when executed by the electronic processor of the parameter estimator 160, cause the parameter estimator 160 to perform or control the performance of various functions or methods attributed to the parameter estimator 160 herein (e.g., calculate a parameter of the battery system). The memory of the parameter estimator 160 may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the parameter estimator 160 herein may be embodied as software, firmware, hardware or any combination thereof. In the above examples, the parameter estimator 160 may be configured to receive data from various sources (e.g., the battery 110, the state estimator 130, etc.) and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, or other suitable network.

Various models have been developed to model the electrochemical reactions occurring within the battery 110. One example was developed by Fuller, Doyle, and Newman, the (Newman Model), (*J. Electrochem. Soc.*, Vol. 141, No. 1, January 1994, pp. 1-10), the contents of which are hereby incorporated by reference in their entirety. The Newman Model provides a mathematical model which can be used to estimate the electrochemical processes occurring within the battery 110 based on the measured characteristics.

Physics based electrochemical models, such as the Newman Model, may include numerous ordinary and partial differential equations to describe the behavior of the various parameters within the battery 110—in particular, parameters relating to the chemical composition of the battery itself. The Newman model accurately models many actual physical processes occurring in Li-ion batteries. However, the full Newman model is extremely complex and requires a large number of potentially immeasurable physical parameters to be identified. Identification of such large set of parameters involved in the nonlinear PDE and DAEs is computationally intensive. U.S. application Ser. Nos. 15/010,873, 15/011,148, and 15/011,118, the entire contents of each of which is incorporated herein by reference, discuss various mathematical methods of estimating the results of the various models.

Some aspects of the calculations used for modelling battery states and parameters are relatively less computationally complex. To reduce the computational load placed on the local battery management system 104 (and, thereby, reduce the cost and complexity of the hardware materials required to implement the local battery management system), the identification and calculation of the various states and parameters of the model can be distributed between the local battery management system 104 and a remote calculating system (i.e., the parameter estimator 160).

Furthermore, the sets of outputs from the electrochemical model via the state estimator 130 and parameter estimator 160 include estimations of both rapidly varying states of the battery 110 and estimations of slowly varying parameters of the battery 110. The state and parameter estimation algorithms of the battery 110 may be separated due to the differing time scales on which they change. The parameters may be estimated remotely (e.g., in the cloud) rather than on the local battery management system 104, which allows for the use of more accurate, but computationally intensive models for parameter estimation than would normally be run on the local battery management system. A remote parameter estimator 160 may also allow for parameter estimation based on a longer history of measurements, (e.g., due to increased memory and computational capacity) compared to a local system. The parameter estimator 160 may also run several different algorithms to estimate the parameters, ensuring robustness of the results.

The parameters calculated according to the model by the parameter estimator 160 are sent as periodic updates based on the applicable calculation time scale from the parameter estimator 160 to the state estimator 130 of the battery management system 104 where they are used to regulate battery operation and as inputs to the state estimator 130. Between updates, the battery management system 104 uses the most recent parameter set received from the parameter estimator 160 in controlling certain functions of the battery and in calculating estimated battery states. The duration of the time between updates may be set based on how fast the parameters are expected to change, the availability of a remote connection, as well as the complexity of the estimation algorithms.

The set of outputs from the electrochemical model via the state estimator 130 and parameter estimator 160 include estimations of both rapidly varying states of the battery 110 and estimations of slowly varying parameters of the battery 110. In some embodiments, the mathematical model uses a combination of the states of the battery 110 and current inputs to predict the output of the battery 110. States of a battery cell may for example include the state-of charge, the degree of lithiation (of a lithium battery), and the hysteresis levels of the battery. Parameters of the battery 110 are typically more slowly varying over time than the states of the battery 110. Additionally, a parameter may not be required for the model to predict the present output of the battery 110. Instead knowledge of the parameters of battery 110, which may be called the state-of-health of the battery, relate to the long term functioning of the battery 110. For example, the functioning of the battery 110 over one or more charge/discharge cycles. Additionally, some embodiments comprise parameters which are not directly determinable from the measurement of the current battery 110 characteristics (e.g., voltage, current, resistance, power, temperature and combinations thereof). Examples of battery 110 parameters include the maximum power capacity, internal resistance, volume fractions of active materials, etc.

With an accurate estimation of the states and parameters of a battery 110, the battery management system 104 is able to regulate the operation of the battery 110 such that the life and performance of the battery 110 will be enhanced. For example, by minimizing the change in parameters of the battery 110, the battery management system 104 may allow the battery 110 to undergo an increased number of charge/discharge cycles prior to replacement. In some embodiments the battery management system 104 may regulate the charging of the battery 110 to allow for the efficient intercalation of the oxidizable species rather than deposition on the surface of the electrode. This may minimize the formation of dendrites thus limiting the possibility of the formation of an internal short within the battery 110. In other embodiments the battery management system 104 may regulate the discharge of the battery 110 in order to obtain for example, the maximum total power output from the battery 110.

Figure 2:
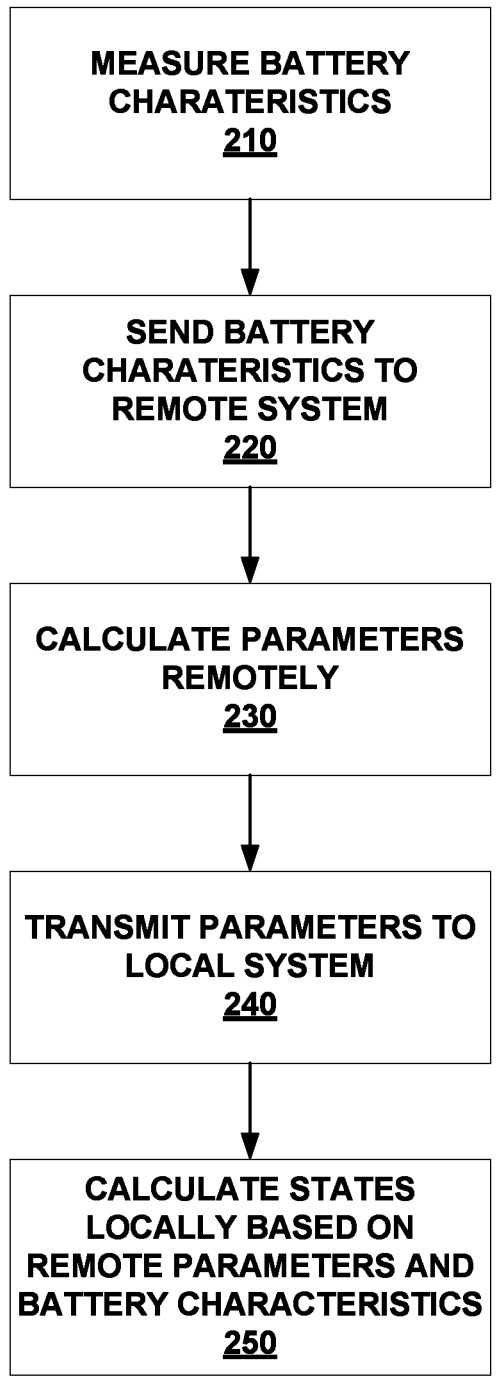
FIG. 2 is a flow chart illustrating an example method of estimating the states and parameters of a battery system, in accordance with some embodiments.

A flowchart of the operation of an embodiment of the estimation of states and parameters of a battery system is presented in FIG. 2. FIG. 2 is described with reference to the battery system 100 of FIG. 1. Characteristics (e.g. voltage, current, and/or temperature) of lithium battery 110 are measured by the battery management system 104 (block 210). The measured characteristics are sent to the remote parameter estimator 160 (block 220). The parameter estimator 160 remotely calculates parameters of the battery 110 (block 230). The remotely calculated parameters are then sent to the local battery management system 104 (block 240). The battery management system 104 (implementing the state estimator 130) calculates the state(s) of the battery 110 based on the remotely calculated parameters and measured characteristics of the battery 110 (block 250).

Although the example of FIG. 2 illustrates a linear process, in some implementations, the calculation of the estimated battery states is not necessarily performed only after updated parameters are received from the remote parameter estimator 160. Instead, in some implementations, the measured characteristics of the battery 110 received by both the remote parameter estimator 160 and the state estimator 130 component of the battery management system 104 concurrently. Using the state estimator 130, the battery management system 104 accesses the most current parameters stored to the local memory 120 and uses these parameters, along with the current measured battery characteristics, to perform the state estimation (block 250). Meanwhile, the remote parameter estimator 160 calculates updated parameters based on the measured battery characteristics and will asynchronously update the parameter values stored on the local memory 120 when the calculation is complete or periodically.

Accordingly, in some implementations, the calculation of the estimated battery states is performed based on whatever parameters are currently stored in the local memory 120 and may be performed/updated multiple times using the same set of stored parameters before a new set of parameters is received from the remote parameter estimator 160 and stored to the local memory 120. Similarly, although the example of FIG. 2 shows the act of "calculating states" (block 250) being performed linearly after the parameters are transmitted to the local system (block 240), in some implementations, the frequency of the calculation of the estimated battery states and the frequency of the remote calculation of the battery parameters are governed independently and the reception of updated battery parameters from the remote parameter estimator 160 does not necessary trigger a new calculation of the estimated battery states.

In the battery system illustrated in FIG. 1 above, the calculation of all of the estimated battery parameters is performed by the remote parameter estimator 160 and no battery parameters are calculated locally by the battery management system 104. However, in other implementations, some estimated battery parameters are calculated locally and are not calculated by the remote parameter estimator. In still other implementations, simplified techniques for calculating certain battery parameters are implemented by the local battery management system and are executed more frequently while more advanced/complex techniques for calculating the same parameters are executed by the remote parameter estimator. These redundant calculations by the parameter estimator may be performed less frequently that the simplified techniques performed locally by the battery management system, but they generally provide more accurate estimations of the parameters.

Figure 3:
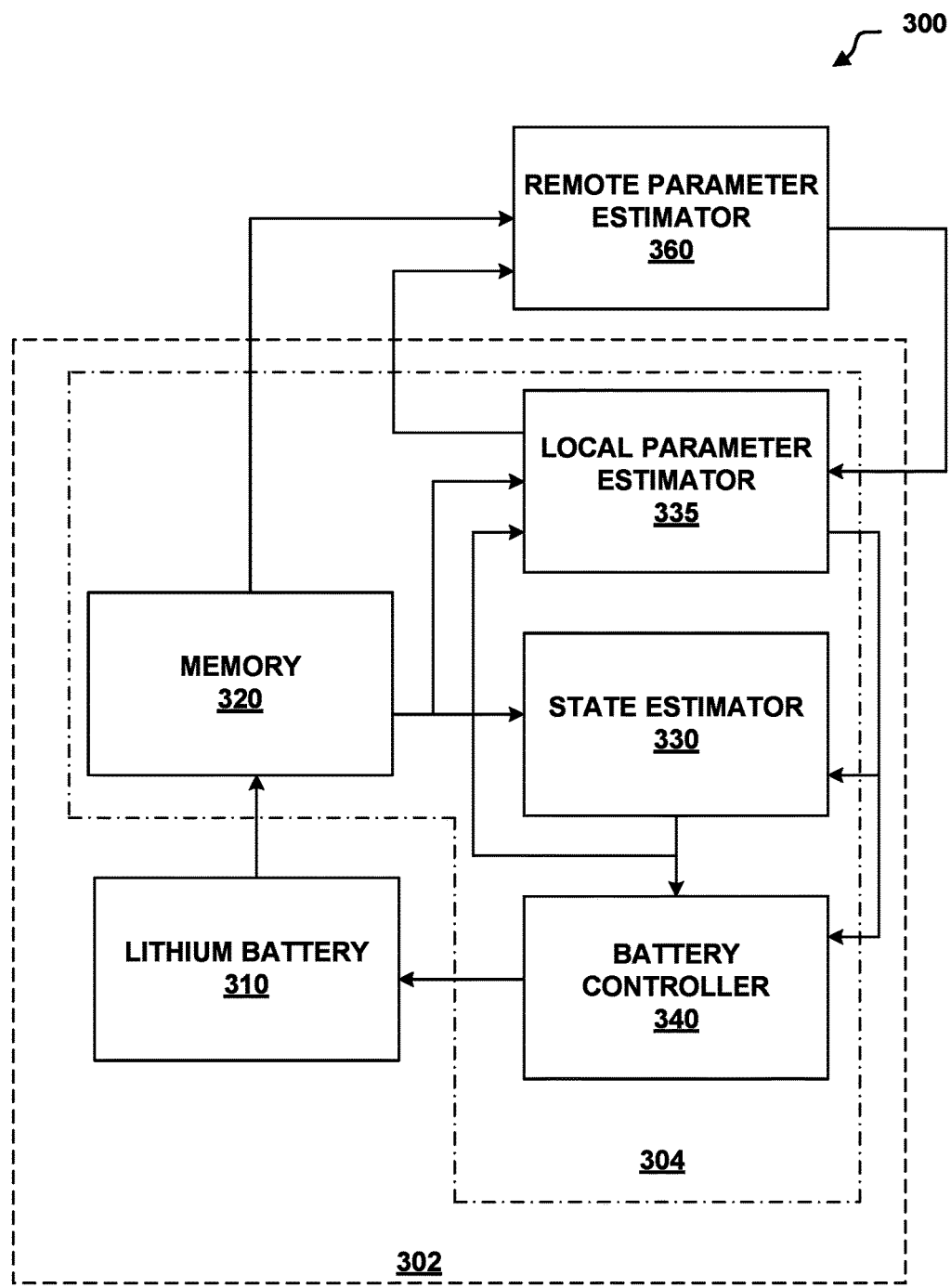
FIG. 3 is a block diagram of a battery system that applies a local battery state and parameter estimation and a remote parameter estimation and verification, in accordance with some embodiments.

FIG. 3 illustrates an example of one such battery system 300. The battery system 300 includes a powered device 302 (e.g., passenger vehicle, consumer electronic device, home, etc.) having a battery 310, which is communicatively connected to a local battery management system (BMS) 304. In one example, the battery management system 304 is electrically connected to the battery 310 via electrical links (e.g., wires). In another example, the battery management system 304 may be wirelessly connected to the battery 310 via a wireless communication network. The battery management system 304 may include for example separately configured components, for example, a microprocessor, memory, and input/output components or may include a microcontroller (with memory and input/output components on a single chip or within a single housing) and combinations thereof. The local battery management system 304 also includes a local memory 320 storing certain data and instructions that are executed by the electronic processor of the battery management system 304 to provide a state estimator 330, a local parameter estimator 335, and a battery controller 340.

The battery management system 304 may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The battery management system 304 may also include a user interface, a communication interface, and other computer implemented devices for performing features not defined herein may be incorporated into the system. In some examples, the battery management system 304 may include other computer implemented devices such as a communication interface, a user interface, a network communication link, and an interface bus for facilitating communication between various interface devices, computing implemented devices, and one or more peripheral interfaces to the microprocessor.

To reduce the computational load placed on the local battery management system (and, thereby, reduce the cost and complexity of the hardware materials required to implement the local battery management system), the identification and calculation of the various states and parameters of the model can be distributed between the local battery management system and a remote calculating system. In the example of FIG. 1, the states of the model are calculated locally while the parameters of the model are calculated remotely. In the example of FIG. 3 the states and at least some parameters of the model are calculated locally while at least some parameters are calculated remotely.

In the example of FIG. 3 the memory of the battery management system 304 stores computer-readable instructions that, when executed by the electronic processor of the battery controller 340, cause the battery management system 304 to perform or control the performance of various functions or methods attributed to battery management system 304 herein (e.g., calculate a state and/or parameter of the battery system, regulate the operation of the battery system, detect an internal short from a dendrite formation). The memory may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the battery management system 304 herein may be embodied as software, firmware, hardware or any combination thereof. In the above examples, the battery management system 304 may be configured to receive data from various sources (e.g., the battery 310, the remote parameter estimator 360, etc.) and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, a cloud computing network, or other suitable network.

The local battery management system 304 is communicatively connected to a remote parameter estimator 360. The remote parameter estimator 360 may include for example, a mainframe, a server, a desktop computer, a tablet, a smartphone, or other device comprising a microprocessor, memory, input/output components, and/or communication components and combinations thereof. The remote parameter estimator 360 may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The battery management system 304 may also include a user interface, a communication interface, and other computer implemented devices for performing features not defined herein may be incorporated into the system. In some examples, the battery management system 304 may include other computer implemented devices such as a communication interface, a user interface, a network communication link, and an interface bus for facilitating communication between various interface devices, computing implemented devices, and one or more peripheral interfaces to the microprocessor.

In the example of FIG. 3, the memory of the remote parameter estimator 360 stores computer-readable instructions that, when executed by the electronic processor of the remote parameter estimator 360, cause the remote parameter estimator 360 to perform or control the performance of various functions or methods attributed to the parameter estimator 360 herein (e.g., calculate a parameter of the battery system). The memory of the remote parameter estimator 260 may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the parameter estimator 360 herein may be embodied as software, firmware, hardware or any combination thereof. In the above examples, the parameter estimator 360 may be configured to receive the data from various sources (e.g., the battery 310, the battery management system 304 (including the local parameter estimator 335, the state estimator 330, and the battery controller 340), etc.) and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, or other suitable network.

The sets of outputs from the electrochemical model via the state estimator 330, local parameter estimator 335, and remote parameter estimator 360 include estimations of both rapidly varying states of the battery 310 and estimations of slowly varying parameters of the battery 310. In some implementations, the state of the battery 310 in combination with the present input to the mathematical model allows the model to predict the present output of the battery 310. States of a battery cell may for example include the state-of-charge, the degree of lithiation (for a lithium battery), or the hysteresis levels of the battery. Parameters of the battery 310 are typically more slowly varying over time than the states of the battery 310. Additionally, a particular parameter may not be required for the model to predict the present output of the battery 310. Instead, knowledge of the parameters of battery 310, which may be called the state-of-health of the battery, relate to the long term functioning of the battery 310 such as, for example, the functioning of the battery 310 over one or more charge/discharge cycles. Some embodiments also estimate and utilize parameters which might not be directly determinable from the measurement of the current battery 310 characteristics (e.g., voltage, current, resistance, power, temperature and combinations thereof). Examples of battery 310 parameters include the maximum power capacity, internal resistance, volume fractions of active materials etc.

The state and parameter estimation algorithms of the battery 310 may be separated due to the differing time scales on which they change—for example, the battery system 300 may be configured to calculate parameters that change on a more rapid time scale using the local parameter estimator 335 and to calculate parameters that change on a slow time scale using the remote parameter estimator 360.

In some implementations, the local parameter estimator 335 is configured to provide real-time estimates of a subset of the full parameter set, especially if there are certain parameters that are expected to change quickly relative to a second subset of parameters while the remote parameter estimator estimate a second subset of parameters that change over a longer time horizon. This reduces the computational load on the local battery management system 304 by calculating only the parameters that are expected to change more rapidly. The other parameters may be estimated remotely (e.g., in the cloud) rather than on the local battery management system 304, which allows for the use of more accurate, but computationally intensive models for parameter estimation than would normally be run on the local battery management system. A remote parameter estimator 360 may also allow for parameter estimation based on a longer history of measurements, (e.g., due to increased memory and computational capacity) compared to a local system. The remote parameter estimator 360 may also run several different algorithms to estimate the parameters, ensuring robustness of the results.

The remote parameter estimator 360 periodically sends parameter updates to the algorithms running on the local parameter estimator 335 and state estimator 330 of the battery management system 304. Between updates, the battery management system 304 operates the battery 310, calculates estimated states, and performs the local parameter estimation using the most recent parameter set received from the remote parameter estimator 360. The time between updates from the remote parameter estimator 360 can be set based on how fast the parameters are expected to change, the availability of a remote connection, as well as the complexity of the estimation algorithms.

Alternatively, in some implementations, the battery management system 304 is configured such that the local parameter estimator 335 calculates some or all of the same battery parameters as the remote parameter estimator 360, but the local parameter estimator 335 uses a simplified algorithm that can be run quickly on the electronic processor of the battery management system 304 to provide a real-time estimate, while the remote parameter estimator 360 uses a more sophisticated and complex algorithm and/or more data to provide a more robust estimate that is used to periodically update the value of the parameter stored and utilized locally by the battery management system 304. One advantage of such a system is the redundancy of estimation, which ensures that reasonably accurate estimates are always available, and the lack of availability of a remote connection does not degrade system performance. A decision making algorithm can also be incorporated into the battery management system 304 to decide whether to accept parameter updates from the remote parameter estimator 360, or continue using the on-board estimates provided by the local parameter estimator 335.

In some implementations the battery management system 304 is configured to regulate the operation of the battery 310 such that the life and performance of the battery is enhanced. For example, the battery management system 304 by minimizing the change in parameters of the battery 310 allows the battery 310 to undergo an increased number of charge/discharge cycles prior to replacement. In some embodiments the battery management system 304 may regulate the charging of the battery 310 to allow for the efficient intercalation of the oxidizable species rather than deposition on the surface of the electrode. This may minimize the formation of dendrites thus limiting the possibility of the formation of an internal short within the battery 310. In other embodiments the battery management system 304 may regulate the discharge of the battery 310 in order to obtain, for example, the maximum total power output from the battery 310.

The examples discussed above describe only a single battery management system 104, 304 and a single remote parameter estimator 160, 360, respectively. However, in some embodiments, a cloud (remote) based network can connect to multiple battery systems. Data from multiple batteries can be aggregated and analyzed to improve estimation of the states and parameters of individual batteries based on trends within the larger data set. Statistical outliers can be identified which, for example, may indicate a problem developing in an individual battery. Statistical outliers can also be identified which, for example, may indicate a battery is preforming much better than the aggregate as a whole, offering insights into conditions that may be used to improve future battery performance.

An embodiment of a battery network 400 is shown in FIG. 4. The battery system 400 includes a parameter aggregation and diagnostics module 410 which is communicatively connected to one or more battery systems 420A, 420B, 420C through 420N, which will be represented in the discussion below as 420, where it is understood that 420 encompasses a set containing one or more battery systems.

The parameter aggregation and diagnostics module 410 is communicatively connected to each of the battery systems 420. The parameter aggregation and diagnostics module 410 may include for example, a mainframe, a server, a desktop computer, a tablet, a smartphone, or other device comprising a microprocessor, memory, input/output components, and/or communication components and combinations thereof. The parameter aggregation and diagnostics module 410 may be wired or wirelessly communicatively connected to the battery system 420. In some examples the parameter aggregation and diagnostics module 410 may be communicatively connected to the battery system 420 by a network such as a cloud computing network, a server, a wireless area network (WAN), a local area network (LAN), an in-vehicle network, or other suitable network.

The parameter aggregation and diagnostics module 410 may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The parameter aggregation and diagnostics module 410 may also include a user interface, a communication interface, and other computer implemented devices for performing features not defined herein may be incorporated into the system. In some examples, parameter aggregation and diagnostics module 410 may include other computer implemented devices such as a communication interface, a user interface, a network communication link, and an interface bus for facilitating communication between various interface devices, computing implemented devices, and one or more peripheral interfaces to the microprocessor.

The battery system 420 includes at least one battery which is communicatively connected to the parameter aggregation and diagnostics module 410. The battery system 420 may include in addition to a battery the components described for the parameter aggregation and diagnostics module 410 above. The parameter aggregation and diagnostics module 410 aggregates parameter data from a fleet of batteries that it connects with. For example, the parameter aggregation and diagnostics module 410 may track the aggregate behavior of the parameters within a fleet of batteries that could be analyzed to help identify faults in individual batteries that show a significant deviation in parameters when compared to the norm and inform a user of the need to service or replace a battery. Long term usage and parameter data from batteries could also be used to improve the onboard estimation and/or control algorithms based on, for example, a typical operating regime for the batteries. Determination whether an individual battery deviates from the norm can be determined by tracking the parameters of a plurality of like batteries over time, aggregating the parameters, and comparing the parameters of the individual battery to the aggregate to determine whether one or more parameters is outside a predetermined range of values for that parameter (e.g. one standard deviation from the mean, two standard deviations from the mean, three standard deviations from the mean, four standard deviations from the mean, five standard deviations from the mean, or other suitable predetermined range).

The embodiments described above have been shown by way of example, and it should be understood that these embodiments may be susceptible to various modifications and alternative forms. For example, the implementation illustrated in FIG. 1 is described as a battery management system 104 including an electronic processor that provides the functionality of a state estimator 130 and a battery controller 140. However, in other implementations, multiple electronic processors and multiple memory units may be incorporated into a single battery management system to implement the state estimator 130 and the battery controller 140 each on an individual electronic processor. Similarly, the components illustrated in the example of FIG. 3 might be implemented using a single electronic processor or multiple electronic processors. It should be further understood that the claims are not intended to be limited to the particular forms disclosed, but rather to cover all modifications, equivalents, and alternatives falling with the spirit and scope of this disclosure.

It is believed that embodiments described herein and many of their attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the invention has been described with reference to various embodiments, it will be understood that these embodiments are illustrative and that the scope of the disclosure is not limited to them. Many variations, modifications, additions, and improvements are possible. More generally, embodiments in accordance with the invention have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A battery system comprising a processor and a memory storing instructions that, when executed by the processor, cause the battery system to:
   determine, based on an output of a sensor, at least one measured characteristic of a battery;
   transmit the at least one measured characteristic from the battery system to a remote processing system;
   receive by the battery system from the remote processing system, at least one parameter value calculated by the remote processing system based on the at least one measured characteristic and using a physics-based battery model, the at least one parameter value being indicative of a physical condition of the battery;
   calculate by the battery system, a value indicative of a state of the battery based on the at least one parameter received from the remote processing system; and
   regulate operation of the battery based on the calculated state of the battery cell.

2. The battery system of claim 1, wherein the instructions, when executed by the processor, further cause the battery system to calculate a first set of parameters based on the at least one measured characteristic, wherein the at least one parameter value calculated by the remote processing system includes a second set of parameters.

3. The battery system of claim 2, wherein the first set of parameters includes parameters expected to change more rapidly than the parameters of the second set of parameters.

4. The battery system of claim 2, wherein the first set of parameters includes parameters which are less computationally intensive than the parameters of the second set of parameters.

5. The battery system of claim 1, wherein the instructions, when executed by the processor, cause the battery system to calculate a value indicative of a state of the battery by applying a physics-based battery model that applies differential algebraic equations to account for physical parameters of a chemical composition of the battery cell.

6. The battery system of claim 5, wherein the instructions, when executed by the processor, cause the battery system to calculate the value indicative of a state of the battery by calculating the value indicative of the state of the battery based on an adjusted gain of an extended Kalman filter and a calculated measurement error.

7. The battery system of claim 1, wherein the instructions, when executed by the processor, cause the battery system to calculate a value indicative of a state of the battery by
  determining a sensitivity covariance, and
  reducing a number of parameters of a Recursive Least Squares filter.

8. The battery system of claim 1, wherein the instructions, when executed by the processor, cause the battery system to calculate the value indicative of a state of the battery further by
  determining a cost function of a Moving Horizon Estimation method based on the at least one measured characteristic, and
  updating the physics-based battery model based on the cost function of a Moving Horizon Estimation Method.

9. The battery system of claim 1, wherein the calculation of the at least one parameter value by the remote processing system occurs at a first time, and wherein the instructions, when executed by the processor, further cause the battery system to
  calculate a value indicative of a state of the battery at a second time based on the at least one parameter that is calculated by the remote processing system at the first time, and calculate a value indicative of a state of the battery at a third time based on the at least one parameter that is calculated by the remote processing system at the first time,
  wherein the second time is not equal to the third time.

10. A method of calculating the states and the parameters of a battery, the method comprising:
  determining based on an output of a sensor, at least one measured characteristic of a battery;
  transmitting the at least one measured characteristic from the battery system to a remote processing system;
  receiving by the battery system from the remote processing system, at least one parameter value calculated by the remote processing system based on the at least one measured characteristic and using a physics-based battery model, the at least one parameter value being indicative of a physical condition of the battery;
  calculating by the battery system, a value indicative of a state of the battery based on the at least one parameter received from the remote processing system; and
  regulating operation of the battery based on the calculated state of the battery cell.

11. The method of claim 10, further comprising calculating, by the battery system, a first set of parameters based on the at least one measured characteristic, wherein the at least one parameter value calculated by the remote processing system includes a second set of parameters.

12. The method of claim 11, wherein the first set of parameters includes parameters expected to change more rapidly than the parameters of the second set of parameters.

13. The method of claim 11, wherein the first set of parameters includes parameters which are less computationally intensive than the parameters of the second set of parameters.

14. The method of claim 10, wherein calculating, by the battery system, the value indicative of the state of the battery includes applying a physics-based battery model that applies differential algebraic equations to account for physical parameters of a chemical composition of the battery cell.

15. The method of claim 14, wherein calculating, by the battery system, the value indicative of the state of the battery includes calculating the value indicative of the state of the battery based on an adjusted gain of an extended Kalman filter and a calculated measurement error.

16. The method of claim 10, wherein calculating, by the battery system, the value indicative of the state of the battery further includes
  determining a sensitivity covariance, and
  reducing a number of parameters of a Recursive Least Squares filter.

17. The method of claim 10, wherein calculating, by the battery system, the value indicative of the state of the battery further includes
  determining a cost function of a Moving Horizon Estimation method based on the at least one measured characteristic, and
  updating the physics-based battery model based on the cost function of a Moving Horizon Estimation Method.

18. The method of claim 10, wherein calculating the at least one parameter value calculated by the remote processing system occurs at a first time, and further comprising:
  calculating, by the battery system, a value indicative of a state of the battery at a second time based on the at least one parameter calculated by the remote processing system at the first time; and
  calculating, by the battery system, a value indicative of a state of the battery at a third time based on the at least one parameter calculated by the remote processing system at the first time,
  wherein the second time is not equal to the third time.

* * * * *